(12) United States Patent
Lee et al.

(10) Patent No.: US 8,294,042 B2
(45) Date of Patent: Oct. 23, 2012

(54) CONNECTOR AND MANUFACTURING METHOD THEREOF

(75) Inventors: Chang-Ming Lee, Taoyuan County (TW); Wen-Fang Liu, Taoyuan County (TW); Shih-Jung Huang, Taoyuan County (TW); Ling-Kai Su, Taipei (TW)

(73) Assignee: Unimicron Technology Corp., Taoyuan (TW)

(*) Notice: Subject to any disclaimer, the term of this patent is extended or adjusted under 35 U.S.C. 154(b) by 220 days.

(21) Appl. No.: 12/844,109

(22) Filed: Jul. 27, 2010

(65) Prior Publication Data

US 2012/0024584 A1 Feb. 2, 2012

(51) Int. Cl.
*H01R 9/00* (2006.01)
*H05K 7/00* (2006.01)
*H05K 1/11* (2006.01)

(52) U.S. Cl. ........ 174/262; 174/261; 174/263; 361/760; 361/772; 361/776

(58) Field of Classification Search ........................ None
See application file for complete search history.

(56) References Cited

U.S. PATENT DOCUMENTS

| | | | |
|---|---|---|---|
| 7,015,584 B2* | 3/2006 | Chow et al. | 257/773 |
| 7,230,440 B2* | 6/2007 | Hantschel et al. | 324/755.05 |
| 7,247,035 B2* | 7/2007 | Mok et al. | 439/81 |
| 7,371,073 B2 | 5/2008 | Williams | |
| 7,461,771 B2* | 12/2008 | Leon | 228/180.22 |
| 7,579,848 B2* | 8/2009 | Bottoms et al. | 324/756.03 |
| 7,758,351 B2* | 7/2010 | Brown et al. | 439/66 |
| 7,989,945 B2* | 8/2011 | Williams et al. | 257/692 |
| 8,167,644 B2* | 5/2012 | Mason et al. | 439/516 |
| 8,179,692 B2* | 5/2012 | Ihara | 361/787 |

FOREIGN PATENT DOCUMENTS

TW I294758 3/2008

* cited by examiner

*Primary Examiner* — Boris Chervinsky
(74) *Attorney, Agent, or Firm* — J.C. Patents

(57) ABSTRACT

A method of manufacturing a connector is provided. Firstly, a substrate having a first surface, a second surface opposite to the first surface and a through hole is provided. Next, a first conductive layer covering the inside wall of the through hole is formed on the substrate. Then, a filler is filled in the through hole to form a filler post. Next, a conductive elastic cantilever is formed over the first surface and electrically connected to the first conductive layer. Then, a gold layer is formed on the conductive elastic cantilever and over the first surface. A solder ball electrically connected to the first conductive layer is formed over the second surface.

6 Claims, 7 Drawing Sheets

CONNECTOR AND MANUFACTURING METHOD THEREOF

BACKGROUND OF THE INVENTION

1. Field of the Invention

The present invention generally relates to a connector and a method of manufacturing the same. More particularly, the present invention relates to a connector and the manufacturing method with low manufacturing cost.

2. Description of Related Art

In general, electronic devices are provided with connectors and openings for exposing the connectors. External circuits such as network lines or audio cables can be inserted into the openings and electrically connected to the connectors.

FIG. 1A is a schematic cross-sectional view of a conventional connector. FIG. 1B is a bottom view of the conventional connector in FIG. 1A. Referring to FIGS. 1A and 1B, the conventional connector 100 includes a substrate 110, a first conductive layer 120, a plurality of connecting terminals 130, a second conductive layer 140, a gold layer 150 and a plurality of solder balls 160. The substrate 110 has a first surface 112, a second surface 114 opposite to the first surface 112, and a plurality of through holes 116 connecting the first surface 112 and the second surface 114. The first conductive layer 120 covers an inner wall 116a of each of the through holes 116, a part of the first surface 112 adjacent to the through holes 116 and a part of the second surface 114 adjacent to the through holes 116. The connecting terminals 130 are disposed around the through holes 116. The second conductive layer 140 covers the connecting terminals 130 and the first conductive layer 120 to electrically connect the connecting terminals 130 to the first conductive layer 120.

In the prior art, to prevent the part of the second conductive layer 140 located in the through holes 116 from being damaged in subsequent process and causing reduction in electrical reliability, the gold layer 150 is used to cover the part of the second conductive layer 140 located in the through holes 116 as well as the connecting terminals 130. Furthermore, for ensuring a complete coverage on the part of the second conductive layer 140 in the through holes 116, the gold layer 150 extends from the through holes 116 to a part of the second conductive layer 140 on the second surface 114 and thereby forms gold rings G. The solder balls 160 are located over the second surface 114, and the solder balls 160 are connected to the part of the second conductive layer 140 exposed by the gold rings G.

In needing the gold layer 150 completely covering the part of the second conductive layer 140 in the through holes 116, the required amount of gold in the prior art is large, while the price of gold goes high and the manufacturing of the conventional connector costs a lot.

Moreover, in the prior art, each of the gold rings G and the corresponding solder ball 160 are close to each other to release more available layout area and improve layout density. Therefore, the solder material may contact the gold rings G in the formation of the solder balls 160. While, the phenomenon of solder wicking occurs as the solder material contacts the gold rings G, and the formed solder balls 160 become smaller or even disappear. Alternatively, the solder balls 160 need to be separated from the gold rings G to prevent the contact between the solder balls 160 and the gold rings G, and thus the pitch between the solder balls 16 can not be reduced.

SUMMARY OF THE INVENTION

The present invention is directed to a method for manufacturing a connector with low manufacturing cost and capable of preventing solder wicking.

The present invention is further directed to a connector in low manufacturing cost.

In the present invention, a method of manufacturing a connector comprises: providing a substrate, the substrate having a first surface, a second surface opposite to the first surface and at least one through hole, wherein the through hole connects the first surface and the second surface; forming a first conductive layer on the substrate, the first conductive layer covering an inside wall of the through hole; filling the through hole with a filler to form a filler post, wherein a part of the first conductive layer is located between the filler post and the substrate; forming a conductive elastic cantilever over the first surface, wherein the conductive elastic cantilever is electrically connected to the first conductive layer and has a fixed end, a free end and a bended portion connected between the fixed end and the free end, the fixed end is connected to the substrate and located at a periphery of the through hole, and the bended portion is curved from the fixed end toward a direction away from the substrate; forming a gold layer on the conductive elastic cantilever and over a part of the first surface; and, forming at least one solder ball on the second surface, wherein the solder ball is electrically connected to the first conductive layer.

The present invention provides a connector including a circuit board, at least one conductive elastic cantilever, a gold layer and at least one solder ball. The circuit board comprises a substrate, a first conductive layer and a filler post. The substrate has a first surface, a second surface opposite to the first surface and at least one through hole, wherein the through hole connects the first surface and the second surface. The first conductive layer is disposed on the substrate to cover an inner wall of the through hole. The filler post is located in the through hole, wherein a part of the first conductive layer is located between the filler post and the substrate. The conductive elastic cantilever is located over the first surface and electrically connected to the first conductive layer. The conductive elastic cantilever has a fixed end, a free end and a bended portion connected between the fixed end and the free end, wherein the fixed end is connected to the circuit board and located at a periphery of the through hole, and the bended portion is curved from the fixed end toward a direction away from the circuit board. The gold layer covers the conductive elastic cantilever. The solder ball is disposed over the second surface and electrically connected to the first conductive layer.

As to the above, the present invention provides the filler post in the through hole to protect the part of the conductive layer in the through hole from being damaged in the subsequent process. The gold layer of the present invention is formed on the conductive elastic cantilever and over the first surface of the substrate where the conductive elastic cantilever is located, rather than in the through hole and over the second surface of the substrate where the solder ball is formed, such that the required amount of gold can be reduced and the manufacturing cost of the connector of the present invention can be saved. Furthermore, since the gold layer is not formed over the second surface of the substrate where the solder ball is formed, the phenomenon of solder wicking caused by the contact between the solder material and the gold layer can be therefore prevented.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

FIGS. 2A through 2K are cross-sectional views illustrating steps for manufacturing a connector according to an embodiment of the present invention. FIG. 3A is a cross-sectional view illustrating a connector according to an embodiment of the present invention. FIG. 3B is a bottom view of the connector in FIG. 3A.

Figure 2A:
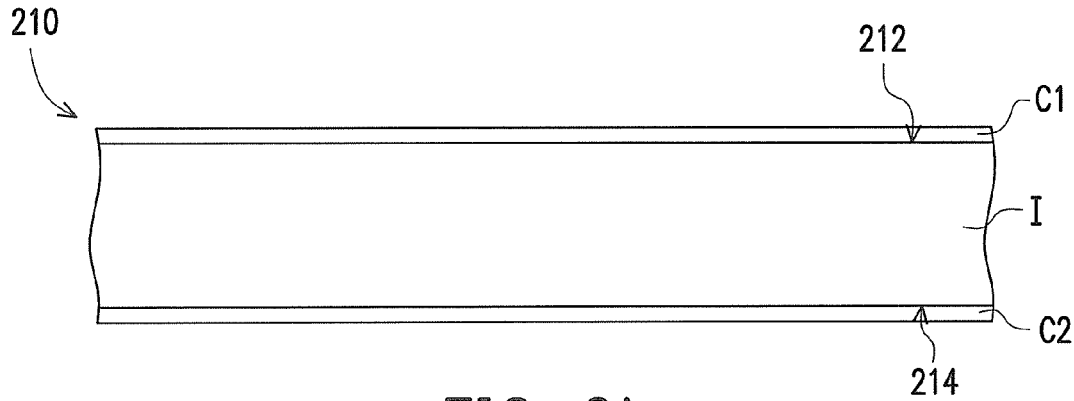
FIGS. 2A through 2K are cross-sectional views illustrating steps for manufacturing a connector according to an embodiment of the present invention.
Figure 3A:
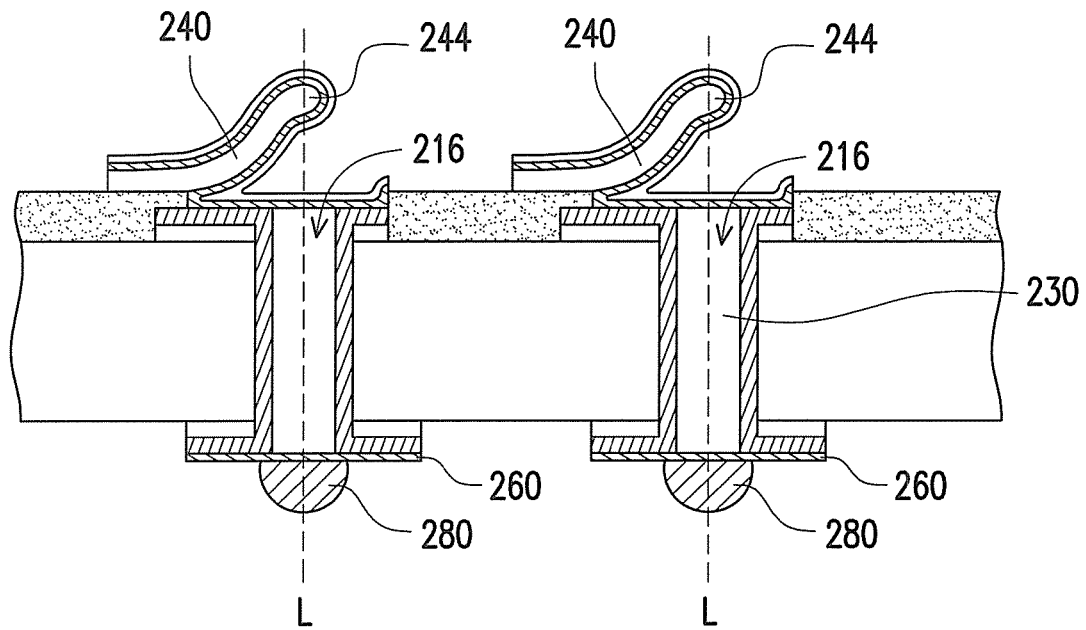
FIG. 3A is a cross-sectional view illustrating a connector according to an embodiment of the present invention.
Figure 3B:
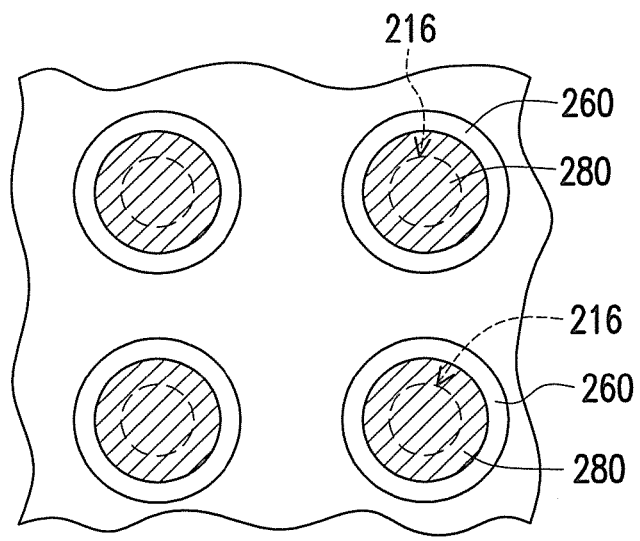
FIG. 3B is a bottom view of the connector in FIG. 3A.

Firstly, referring to FIG. 2A, a substrate 210 having a first surface 212 and a second surface 214 opposite to the first surface 212 is provided. The substrate 210 can be, for example, a double sided board having a single dielectric layer interlaid between two conductive layers, a single sided board having a single dielectric layer with a conductive layer at one side, a single dielectric layer, or a multilayered board composed of multiple dielectric layers and multiple conductive layers alternately stacked with one another.

In the present embodiment, the substrate 210 may be a double sided board including a dielectric layer I and two conductive layers C1 and C2, wherein the dielectric layer I has the first surface 212 and the second surface 214, while the two conductive layers C1 and C2 are respectively located on the first surface 212 and the second surface 214.

Figure 2B:
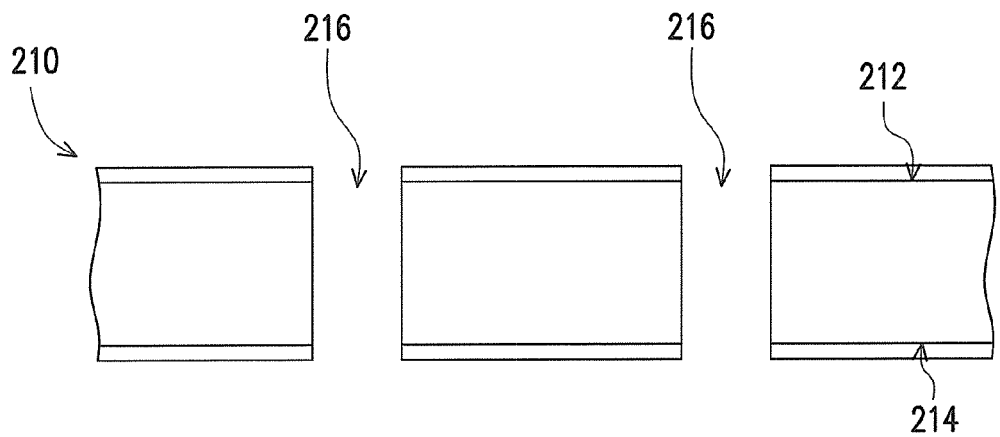

Then, referring to FIG. 2B, a plurality of through holes 216 can be formed in the substrate 210 by performing a drilling process, wherein the through holes 216 connect the first surface 212 and the second surface 214 and penetrate the conductive layers C1 and C2.

Figure 2C:
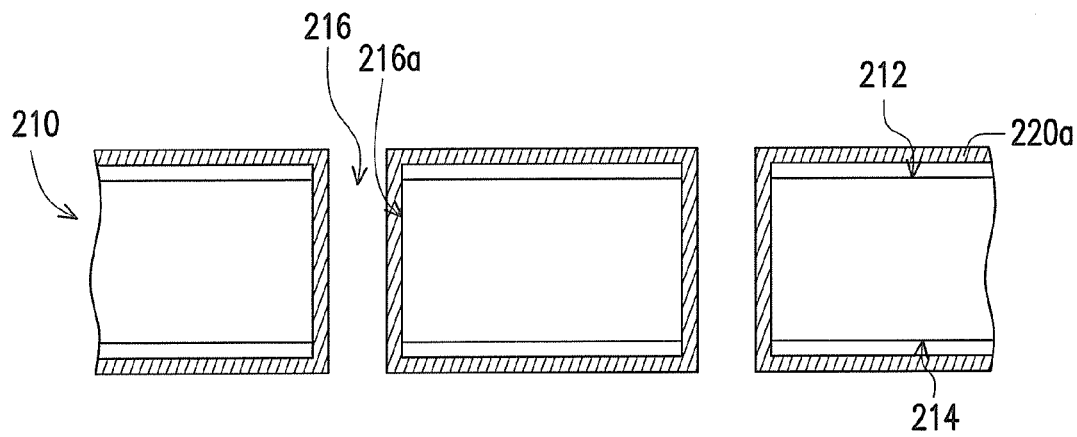

Next, referring to FIG. 2C, in the present embodiment, a panel plating process may be performed to form a conductive material layer 220a on the substrate 210, wherein the conductive material layer 220a completely covers the substrate 210. More specifically, the conductive material layer 220a is over the first surface 212 and the second surface 214, and is on an inner wall 216a of each of the through holes 216 of the substrate 210.

Figure 2D:
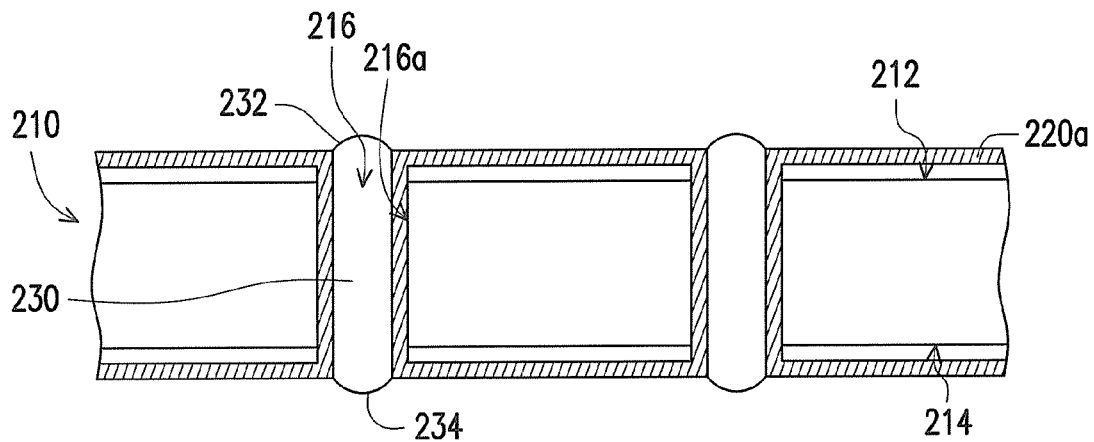

Then, referring to FIG. 2D, a filler is filled in each of the through holes 216 to form a filler post 230, wherein the material of the filler post 230 comprises ink or other applicable filling material. Each of the filler posts 230 has a third end 232 and a fourth end 234 opposite to the third end 232. A part of the conductive material layer 220a is located between the filler posts 230 and the substrate 210.

Figure 2E:
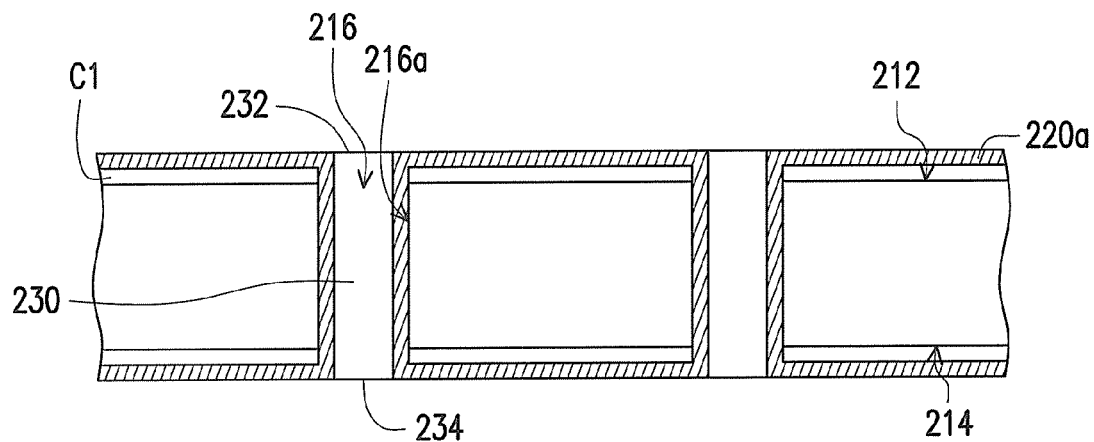

Then, referring to FIG. 2E, in the present embodiment, the part (i.e. the third end 232 and the fourth end 234) of each of the filler posts 230 protruding from the corresponding through hole 216 may be ground, such that the third terminal 232 is coplanar with the part of the conductive material layer 220a located over the first surface 212, and the fourth terminal 234 is coplanar with the part of the conductive material layer 220a located over the second surface 214.

Figure 2F:
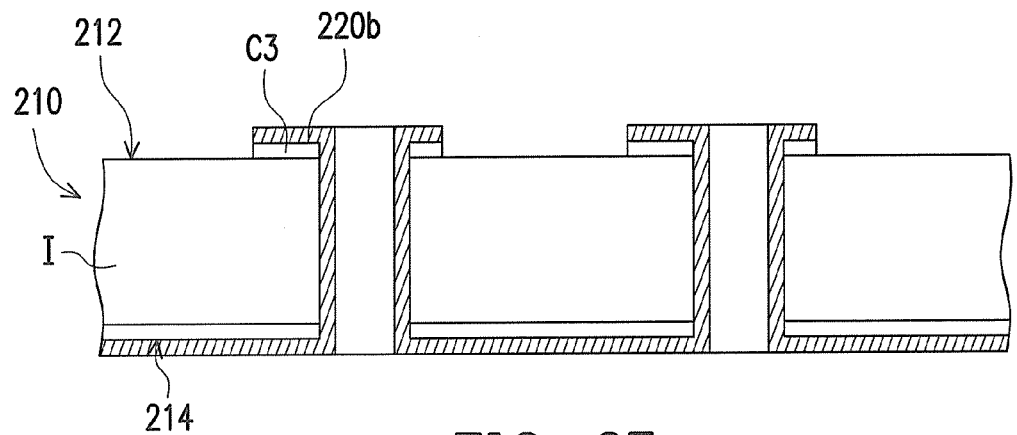

Next, referring to FIG. 2F, a part of the conductive material layer 220a located over the first surface 212 and the conductive layer C1 are patterned to form a patterned conductive material layer 220b and a patterned conductive layer C3.

Figure 2G:
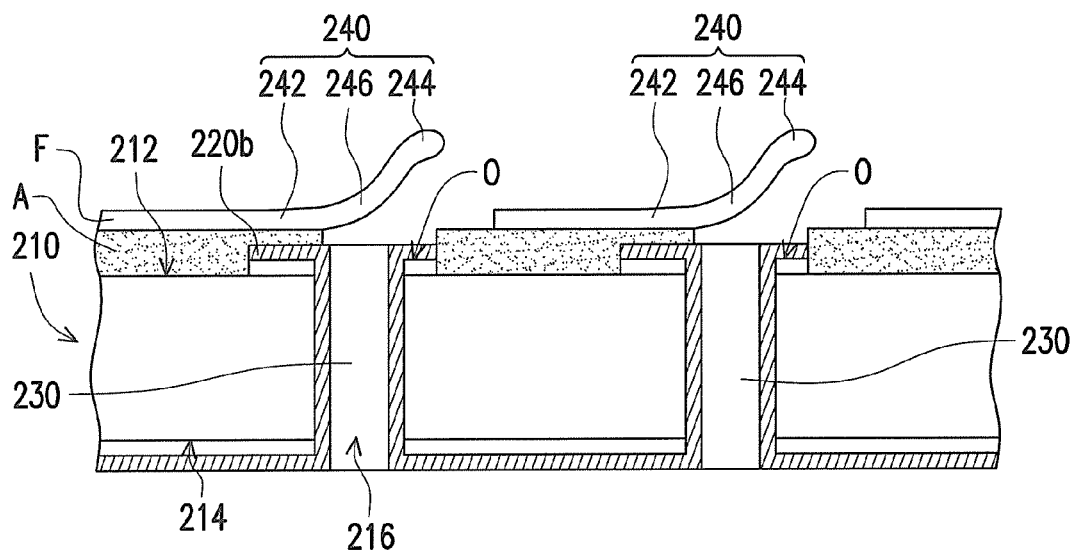

Then, referring to FIG. 2G, a plurality of conductive elastic cantilevers 240 are formed over the first surface 212. Each of the conductive elastic cantilevers 240 has a fixed end 242, a free end 244 and a bended portion 246 connected between the fixed end 242 and the free end 244, wherein the fixed end 242 is connected to the substrate 210 and located at a periphery of the corresponding through hole 216, and the bended portion 246 is curved from the fixed end 242 toward a direction away from the substrate 210.

In the present embodiment, a method of forming the conductive elastic cantilevers 240 is illustrated below. However, the illustrated method of forming the conductive elastic cantilevers 240 is exemplary, while the present invention is not limited thereby. Firstly, an adhesive layer A (e.g. an insulating adhesive layer or low-flow prepreg) and an conductive elastic foil F (e.g. a patterned copper foil) are provided, wherein the adhesive layer A is located between the substrate 210 and the conductive elastic foil F, the conductive elastic foil F has the conductive elastic cantilevers 240, and the adhesive layer A has a plurality of openings O. Then, the conductive elastic foil F, the adhesive layer A and the substrate 210 are laminated, such that the conductive elastic foil F can be fixed in the substrate 210 via the adhesive layer A. Each of the openings O of the adhesive layer exposes the corresponding filler post 230 and the patterned conductive material layer 220b, and each of the conductive elastic cantilevers 240 is located over the corresponding opening O.

Figure 2H:
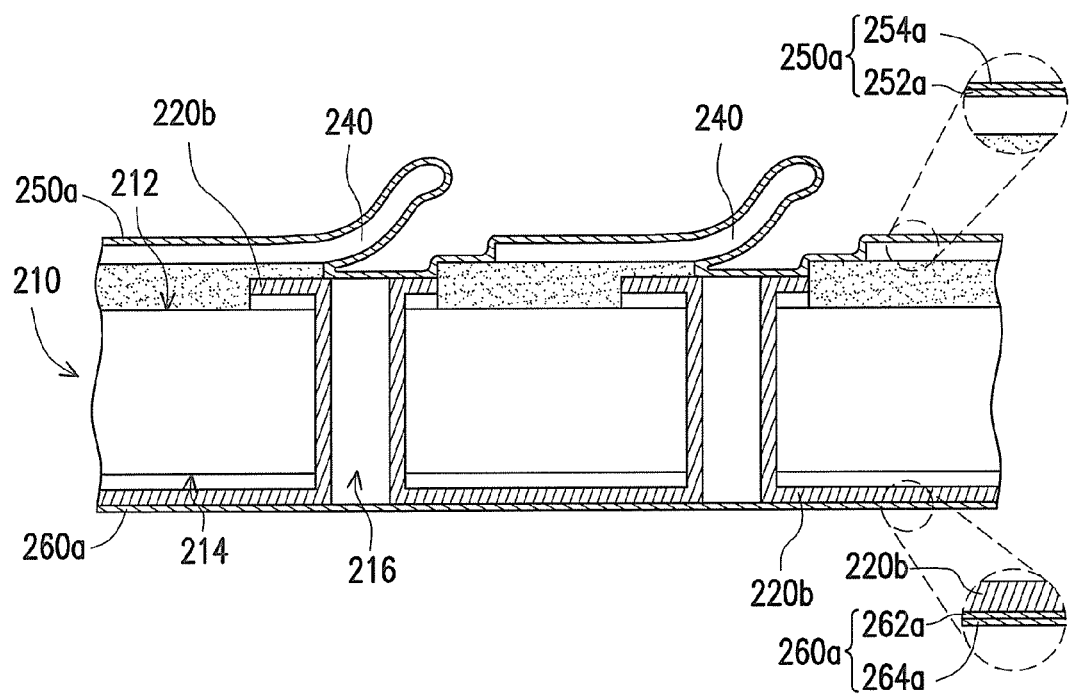

Next, referring to FIG. 2H, in the present embodiment, a conductive material layer 250a is formed to completely cover the conductive elastic cantilevers 240 and over the first surface 212, wherein the conductive material layer 250a is electrically connected to the conductive elastic cantilevers 240 and the patterned conductive material layer 220b. Specifically, the conductive material layer 250a includes a copper layer 252a and a nickel layer 254a. The method of forming the conductive material layer 250a comprises forming the copper layer 252a to completely cover the conductive elastic cantilevers 240 and over the first surface 212 first, and then, the nickel layer 254a is formed to completely cover the copper layer 252a. In the present embodiment, a conductive material layer 260a is formed to be completely over the second surface 214 at the time of forming the conductive material layer 250a. The conductive material layer 260a includes a copper layer 262a and a nickel layer 264a. The method of forming the conductive material layer 260a comprises forming the copper layer 262a to be completely over the second surface 214 first, and then, the nickel layer 264a is formed to completely cover the copper layer 262a.

Figure 2I:
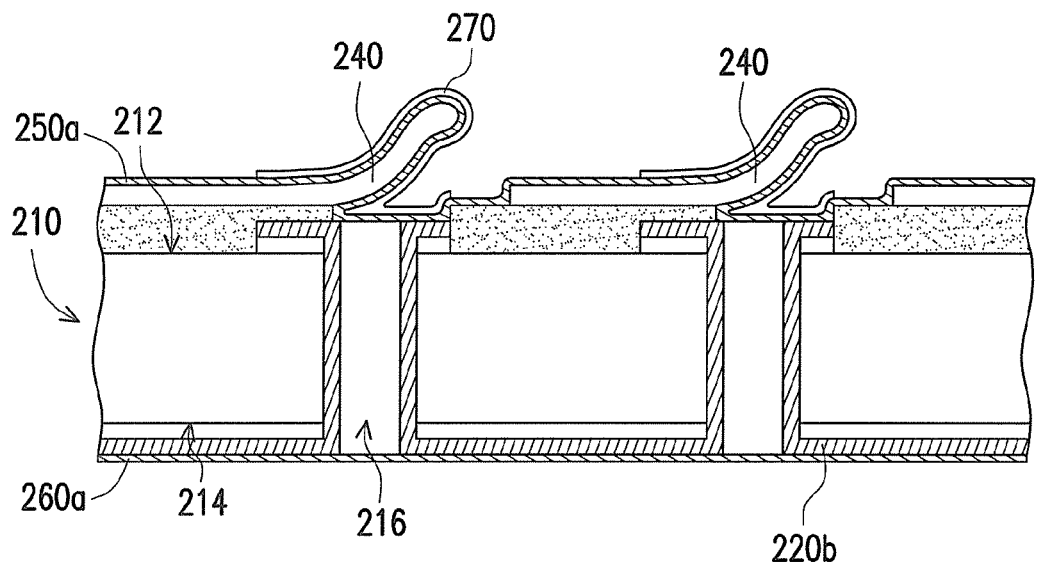

Then, referring to FIG. 2I, a gold layer 270 is formed on the conductive elastic cantilevers 240 and over a part of the first surface 212. In the present embodiment, the method of forming the gold layer 270 is, for example, forming a plating mask (not shown) such as a patterned photo-resist on the conductive material layer 250a, wherein the plating mask exposes a predetermined region on the conductive material layer 250a for forming the gold layer 270. Next, the gold layer 270 can be formed by performing a plating process by using the plating mask, and then, the plating mask is removed.

Figure 2J:
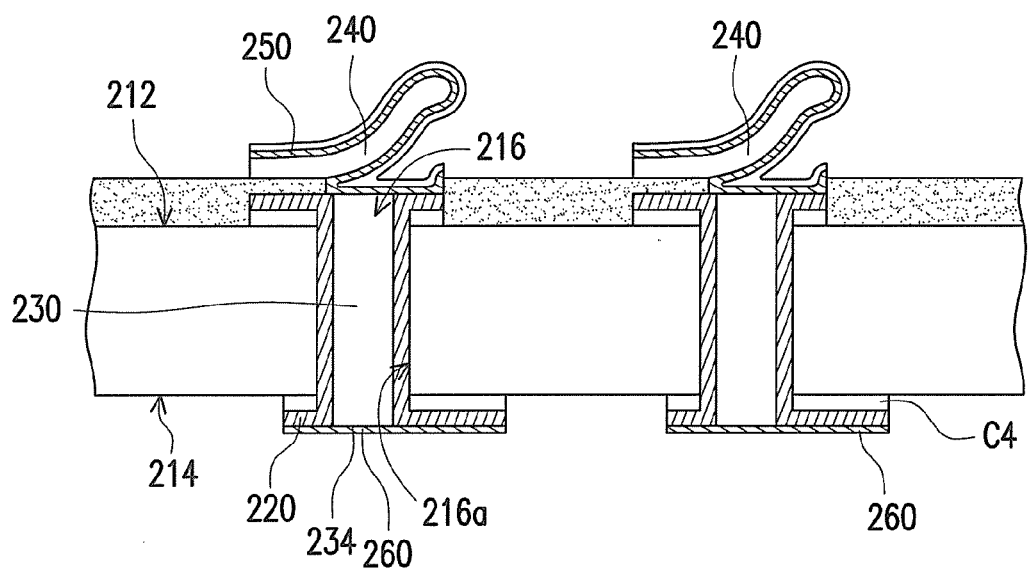

Then, referring to FIG. 2J, the part of the conductive material layer 250a over the first surface 212 is patterned to obtain the second conductive layer 250. In the present embodiment, parts of the conductive material layer 260a and the patterned conductive material layer 220b located over the second surface 214 are patterned as well as the conductive layer C2 at the time of patterning the conductive material layer 250a, so as to form a plurality of bonding pads 260, a first conductive layer 220 and a patterned conductive layer C4, wherein the first conductive layer 220 extends from the first surface 212 to the second surface 214 through the inner wall 216a of each of the through holes 216, the bonding pads 260 are located on the first conductive layer 220 and each of the bonding pads 260 covers the fourth end 234 of the corresponding filler post 230.

Figure 2K:
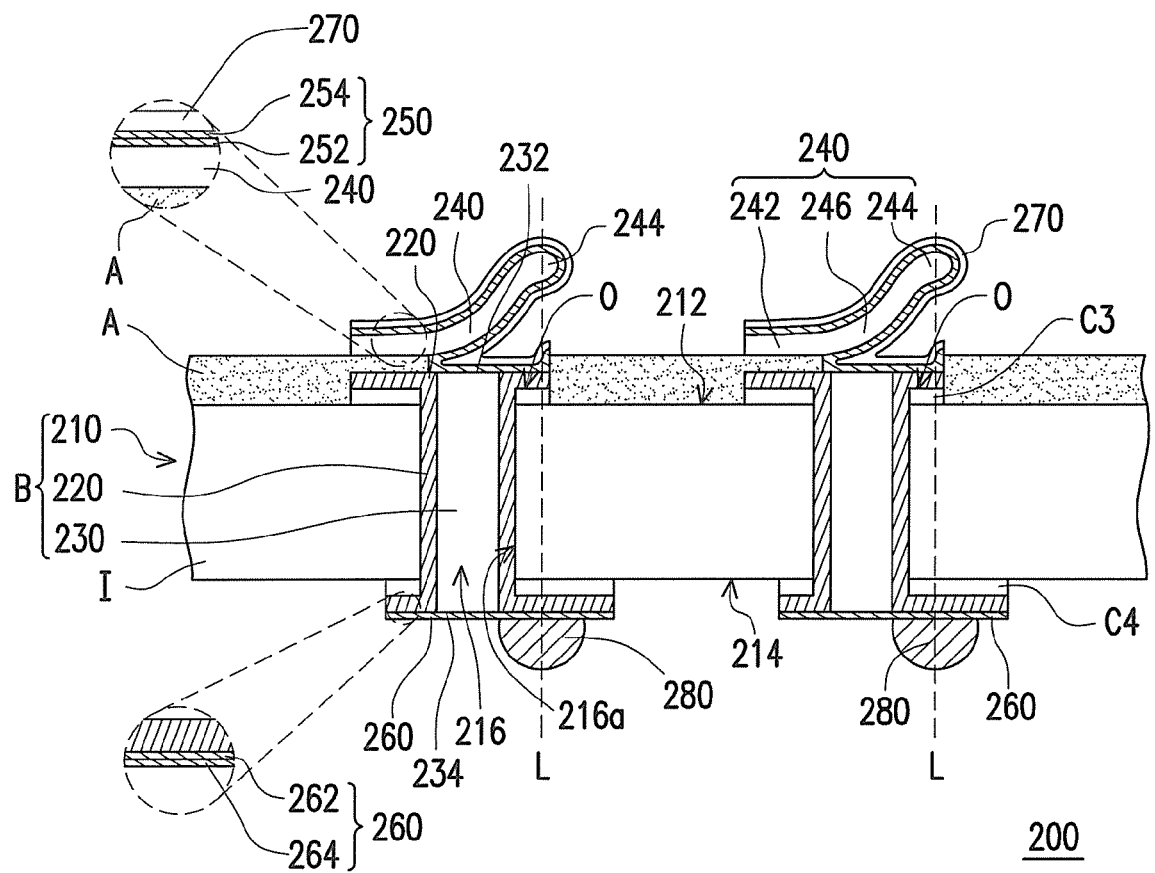

Then, referring to FIG. 2K, solder balls 280 are formed on the bonding pads 260 respectively, and the solder balls 280 are electrically connected to the first conductive layer 220 via the bonding pads 260. So far, the connector 200 of the present embodiment is approximately formed. In the present embodiment, preferably, the free end 244 of each of the conductive elastic cantilevers 240 and the corresponding solder ball 280 are both located in the same vertical line L perpendicular to the first surface 212. However, in fact, a tolerance of about 0.2 mm between the free end 244 and the vertical line L or between the solder ball 280 and the vertical line L is allowed. In the addition, the filler post 230 is located at a side of its corresponding vertical line L rather than in the vertical line L.

Figure 1A:
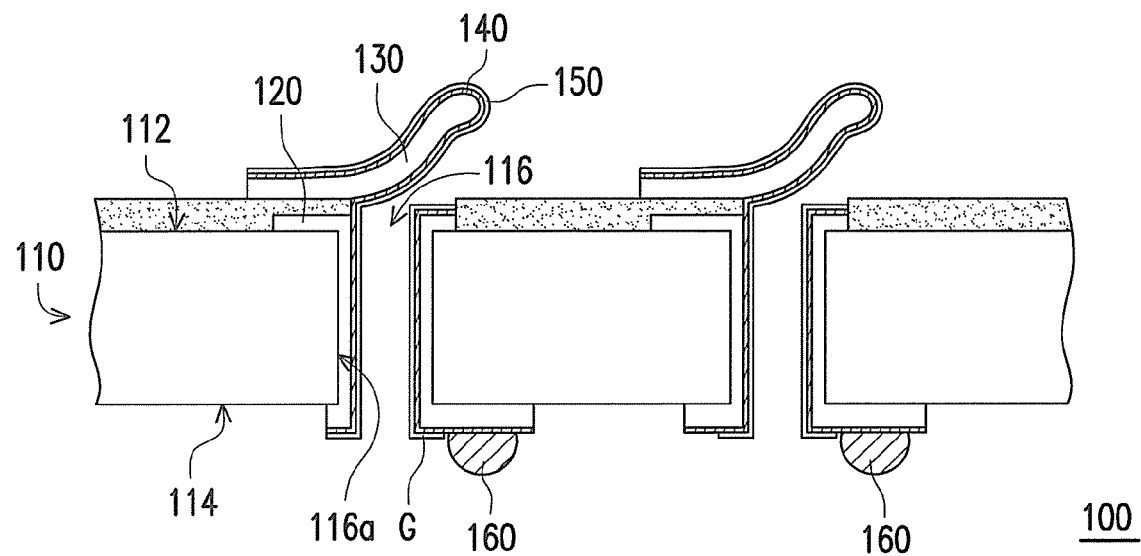
FIG. 1A is a schematic cross-sectional view of a conventional connector.
Figure 1B:
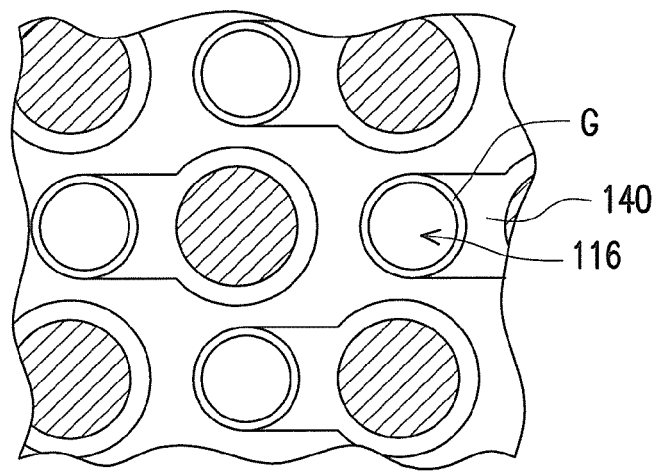
FIG. 1B is a bottom view of the conventional connector in FIG. 1A.

It is noted that since the through hole 216 of the present embodiment is filled with the filler post 230, the part of the first conductive layer 220 located in the through hole 216 can be protected from being damaged in the subsequent process. Therefore, the gold layer 270 of the present embodiment can be formed merely on the conductive elastic cantilevers 240 and over a part of the first surface 212, rather than in the through hole 116 and over the second surface 114 as shown in FIG. 1A, such that the required amount of gold can be reduced and the manufacturing cost of the connector of the present embodiment can be saved. Furthermore, since the gold layer 270 is not formed over the second surface 214 where the solder balls 280 are formed, the phenomenon of solder wicking caused by the contact between the solder material and the gold layer can be prevented.

The structure of the connector 200 depicted in FIG. 2K is elaborated hereinafter.

Referring to FIG. 2K, the connector 200 of the present embodiment includes the circuit board B, the conductive elastic cantilevers 240, the gold layer 270 and the solder balls 280. The circuit board B comprises the substrate 210, the first conductive layer 220 and the filler posts 230. The substrate 210 has the first surface 212, the second surface 214, the through holes 216, the dielectric layer I and the two patterned conductive layers C3 and C4. The dielectric layer I has the first surface 212 and the second surface 214, the conductive layers C3 and C4 are respectively located on the first surface 212 and the second surface 214, and the through holes 216 connect the first surface 212 and the second surface 214 and penetrate the first surface 212 and the second surface 214.

The first conductive layer 220 is disposed on the substrate 210 to cover the inner wall 216a of each of the through holes 216. In detail, according to the present embodiment, the first conductive layer 220 extends from the first surface 212 to the second surface 214 through the through holes 216. The filler posts 230 are located in their corresponding through holes 216, wherein a part of the first conductive layer 220 is located between the filler posts 230 and the substrate 210. In addition, each of the filler posts 230 has the third end 232 and the fourth end 234 opposite to the third end 232, wherein the third end 232 is coplanar with a part of the first conductive layer 220 located over the first surface 212, and the fourth end 234 is coplanar with a part of the first conductive layer 220 located over the second surface 214.

The conductive elastic cantilevers 240 are located over the first surface 212 and electrically connected to the first conductive layer 220. Each of the conductive elastic cantilevers 240 has the fixed end 242, the free end 244 and the bended portion 246 connected between the fixed end 242 and the free end 244, wherein the fixed end 242 is connected to the circuit board B and located at the periphery of the corresponding through hole 216, and the bended portion 246 is curved from the fixed end 242 toward a direction away from the circuit board B. The gold layer 270 covers the conductive elastic cantilevers 240 and the second conductive layer 250.

More specifically, in the present embodiment, the fixed end 242 can be connected to the circuit board B via the adhesive layer A over the first surface 212, wherein the adhesive layer A has the openings O, and each of the openings O exposes the corresponding filler post 230 and the part of the first conductive layer 220. Furthermore, the conductive elastic cantilevers 240 can be electrically connected to the first conductive layer 220 via the second conductive layer 250 covering the conductive elastic cantilevers 240 and the first conductive layer 220. The second conductive layer 250 includes a copper layer 252 and a nickel layer 254, wherein the copper layer 252 covers the conductive elastic cantilevers 240 and the first conductive layer 220, while the nickel layer 254 covers the copper layer 252, and the gold layer 270 covers the nickel layer 254.

In the present embodiment, the plurality of bonding pads 260 are formed over the second surface 214, wherein each of the second bonding pads 260 covers the corresponding filler post 230 and the first conductive layer 220. In more detail, each of the bonding pads 260 includes the copper layer 262 and the nickel layer 264, wherein the copper layer 262 covers the corresponding filler post 230 and the first conductive layer 220, while the nickel layer 264 covers the copper layer 262.

The solder balls 280 are located on the bonding pads 260, and the solder balls 280 are electrically connected to the first conductive layer 220 via the bonding pads 260. In the present embodiment, preferably, the free end 244 of each of the conductive elastic cantilevers 240 and the corresponding solder ball 280 are both located in the same vertical line L perpendicular to the first surface 212. However, in fact, a tolerance of about 0.2 mm between the free end 244 and the vertical line L or between the solder ball 280 and the vertical line L is allowed. In the addition, the filler post 230 may be located at a side of its corresponding vertical line L rather than in the vertical line L.

In addition, referring to FIGS. 3A and 3B, the filler post 230 can further be located in the vertical line L. With reference to FIGS. 3A and 3B, the structure of the connector 300 of the present embodiment is similar to the structure of the connector 200 depicted in FIG. 2K, while the difference between the connector 300 and the connector 200 lies in that the free end 244 of the conductive elastic cantilever 240 and the solder ball 280 in the present embodiment are aligned with the through hole 216.

Since the through hole 216 of the present embodiment is filled with the filler post 230, the bonding pad 260 can cover the filler post 230, and the solder 280 can be disposed immediately under the through hole 216. Accordingly, the size of the bonding pads 260 can be reduced, and the pitch between the solder balls 280 can be shortened by merely regarding the arrangement of the conductive elastic cantilevers 240.

In summary, the present invention provides the filler post in the through hole to protect the part of the conductive layer in the through hole from being damaged in the subsequent process. The gold layer of the present invention is formed on the conductive elastic cantilever and over the first surface of the substrate where the conductive elastic cantilever is located, rather than in the through hole and over the second surface of the substrate where the solder ball is formed, such that the required amount of gold can be reduced and the manufacturing cost of the connector of the present invention can be saved. Furthermore, since the gold layer is not formed over the second surface of the substrate where the solder ball is formed, the phenomenon of solder wicking caused by the contact between the solder material and the gold layer can be therefore prevented.

In addition, since the through hole of the present invention is filled with the filler post, the bonding pad can cover the filler post, and the solder ball can be disposed immediately under the through hole. Thus, the size of the bonding pads can be reduced, and the pitch between the solder balls can be shortened by merely regarding the arrangement of the conductive elastic cantilevers.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A connector, comprising:
    a circuit board, comprising:
        a substrate, having a first surface, a second surface opposite to the first surface and at least one through hole, wherein the through hole connects the first surface and the second surface;
        a first conductive layer, disposed on the substrate to cover an inner wall of the through hole;
        a filler post, located in the through hole, wherein a part of the first conductive layer is located between the filler post and the substrate;
    at least a conductive elastic cantilever, located over the first surface and electrically connected to the first conductive layer, the conductive elastic cantilever having a fixed end, a free end and a bended portion connected between the fixed end and the free end, wherein the fixed end is connected to the circuit board and located at a periphery of the through hole, and the bended portion is curved from the fixed end toward a direction away from the circuit board;
    a gold layer, covering the conductive elastic cantilever and being over a part of the first surface; and
    at least one solder ball, disposed over the second surface and electrically connected to the first conductive layer.

2. The connector as claimed in claim 1, wherein the free end and the solder ball are both located in a vertical line perpendicular to the first surface.

3. The connector as claimed in claim 2, wherein the filler post is located in the vertical line.

4. The connector as claimed in claim 2, wherein the filler post is located at a side of the vertical line.

5. The connector as claimed in claim 1, wherein the first conductive layer is extended from the first surface to the second surface via the through hole, the filler post has a third end and a fourth end opposite to the third end, the third end is coplanar with a part of the first conductive layer located over the first surface, and the fourth end is coplanar with a part of the first conductive layer located over the second surface.

6. The connector as claimed in claim 1, further comprising:
    an adhesive layer, connected between the circuit board and the conductive elastic cantilever.

* * * * *